US007608835B1

(12) United States Patent
Sakurai et al.

(10) Patent No.: US 7,608,835 B1

(45) Date of Patent: Oct. 27, 2009

(54) RADIATION IMAGE CONVERTING PANEL

(75) Inventors: Jun Sakurai, Hamamatsu (JP); Ichinobu Shimizu, Hamamatsu (JP); Gouji Kamimura, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/331,628

(22) Filed: Dec. 10, 2008

(30) Foreign Application Priority Data

Apr. 21, 2008 (JP) ........................... P2008-110372

(51) Int. Cl.
*H01L 27/146* (2006.01)

(52) U.S. Cl. .................................... 250/370.09; 438/87

(58) Field of Classification Search ............ 250/370.09; 438/87

See application file for complete search history.

(56) References Cited

U.S. PATENT DOCUMENTS 4,126,150 A * 11/1978 Bell et al. ................... 136/255
4,344,803 A * 8/1982 Kasper ...................... 148/33.3
6,259,099 B1 * 7/2001 Foulon et al. .......... 250/370.14
2008/0083877 A1 * 4/2008 Nomura et al. ........ 250/370.11
2008/0121807 A1 * 5/2008 Valvo et al. ............ 250/370.07

FOREIGN PATENT DOCUMENTS

JP 2-058000 2/1990
JP 2005-315786 11/2005

* cited by examiner

*Primary Examiner*—David P Porta
*Assistant Examiner*—Jessica L Eley
(74) *Attorney, Agent, or Firm*—Drinker Biddle & Reath LLP

(57) ABSTRACT

The present invention relates to a radiation image converting panel that effectively prevents deterioration in fluorescence lifetime by a simpler structure. The radiation image converting panel comprises a support body, and a radiation converting film formed on the support body. The radiation converting film is formed on a film forming region which exists within a first main surface of the support body and includes at least a gravity center position of the first main surface. The radiation converting film is doped with Eu, and an Eu concentration distribution has a concentration gradient so as to become higher in the periphery than in the vicinity of the center of the radiation convert film. By thus providing a concentration gradient for the concentration of Eu to be doped, a drop in luminance in the periphery of the radiation converting film can be reduced.

6 Claims, 8 Drawing Sheets

1
I
II
G
100b
100a
300
200
100
A1
B1
C1

| Eu-CONCENTRATION (wt%) | INITIAL RATIO |
|---|---|
| 0.0082 | 0.520 |
| 0.013 | 0.520 |
| 0.014 | 0.621 |
| 0.023 | 0.620 |
| 0.0212 | 0.590 |
| 0.0296 | 0.720 |
| 0.032 | 0.761 |
| 0.043 | 0.724 |
| 0.0512 | 0.815 |
| 0.062 | 0.780 |
| 0.068 | 0.866 |
| 0.072 | 0.960 |
| 0.076 | 0.910 |
| 0.088 | 0.930 |
| 0.095 | 0.920 |
| 0.1 | 0.910 |

| DISTANCE FROM GRAVITY CENTER POSITION G (mm) | SAMPLE | | | | |
|---|---|---|---|---|---|
| | NO. 1 Eu-CONCENTRATION (wt%) | NO. 2 Eu-CONCENTRATION (wt%) | NO. 3 Eu-CONCENTRATION (wt%) | NO. 4 Eu-CONCENTRATION (wt%) | NO. 5 Eu-CONCENTRATION (wt%) |
| 0 | 0.0786 | 0.0847 | 0.0647 | 0.0299 | 0.0173 |
| 50 | 0.0845 | 0.0799 | 0.0639 | 0.0291 | 0.0166 |
| 100 | 0.1042 | 0.1183 | 0.0864 | 0.0315 | 0.0178 |
| 150 | 0.1008 | 0.1084 | 0.0865 | 0.0326 | 0.0228 |
| 200 | 0.0987 | 0.1045 | 0.0814 | 0.0321 | 0.0219 |
| 250 | 0.0969 | 0.0982 | 0.0870 | 0.0324 | 0.0227 |

Fig.8

| SAMPLE | FLUORESCENCE LIFETIME |
|---|---|
| NO.1 | ○ |
| NO.2 | ○ |
| NO.3 | ○ |
| NO.4 | △ |
| NO.5 | △ |

RADIATION IMAGE CONVERTING PANEL

BACKGROUND OF THE INVENTION

1. Field of the Invention

The present invention relates to a radiation image converting panel comprising a radiation converting film having a columnar crystal structure, which converts an incident radiation ray to a visible light.

2. Related Background Art

Radiation images typified by X-ray images have conventionally been widely used for purposes such as disease diagnosis. As a technique for obtaining such a radiation image, for example, a radiation image recording and reproducing technique using a radiation converting film that accumulates and records irradiated radiation energy, and also emits a visible light according to radiation energy accumulated and recorded as a result of irradiating an excitation light has been widely put into practical use.

A radiation image converting panel to be applied to such a radiation image recording and reproducing technique as this includes a support body and a radiation converting film provided on the support body. As the radiation converting film, a photostimulable phosphor layer having a columnar crystal structure formed by vapor-phase growth (deposition) has been known. When the photostimulable phosphor layer has a columnar crystal structure, since a photostimulable excitation light or photostimulable emission is effectively suppressed from diffusing in the horizontal direction (reaches the support body surface while repeating reflection at crack (columnar crystal) interfaces), this allows remarkably increasing the sharpness of an image by photostimulable emission.

For example, Japanese Patent Application Laid-Open No. H02-58000 has proposed a radiation image converting panel having a photostimulable phosphor layer for which formed by a vapor-phase deposition method on a support body are slender columnar crystals with a constant tilt with respect to a normal direction of the support body. Furthermore, Japanese Patent Application Laid-Open No. 2005-315786 has proposed a technique for preventing, by sealing a photostimulable phosphor layer formed on a support body with a moisture-proof protective film made of a base material having a surface roughness Ra of 20 nm or less and a multilayered moisture-proof layer, deterioration of the photostimulable phosphor layer due to moisture and the like.

SUMMARY OF THE INVENTION

The present inventors have examined the conventional radiation image converting panels in detail, and as a result, have discovered the following problems. That is, as a result of a fluorescence lifetime evaluation performed for a radiation converting film of the conventional radiation image converting panel at a constant temperature and high humidity by the inventors, it has been discovered that there is a considerable difference in drops in luminance between the vicinity of center and periphery of the radiation converting film. Here, the fluorescence lifetime evaluation is a test for quantifying drops in luminance value by showing luminance values of samples used for one month (720 hours) under an environment with a temperature of 25° C. and a humidity of 50% as ratios to initial luminance values.

In the technique described in the above Japanese Patent Application Laid-Open No. 2005-315786, the characteristics of a radiation converting film as described above have not been taken into consideration at all. Therefore, in accordance with the technique of Japanese Patent Application Laid-Open No. 2005-315786 for uniformly sealing a radiation converting film as a whole by a moisture-proof protective film with a special structure, there has been a problem that the structure of a radiation image converting panel as a whole is complicated (complication of the manufacturing process).

The present invention has been developed to eliminate the problems described above. It is an object of the present invention to provide a radiation image converting panel that effectively prevents deterioration in fluorescence lifetime of the entire panel by a simpler structure.

A radiation image converting panel according to the present invention has been completed by the inventors' discovery that a drop in luminance of the panel can be effectively suppressed by controlling the concentration of Eu to be doped in a radiation converting film. In concrete terms, a radiation image converting panel according to the present invention comprises a support body, and a radiation converting film formed on the support body. The support body includes a parallel plate having a first main surface on which the radiation converting film is formed and a second main surface opposing the first main surface. The radiation converting film is formed on a film forming region which exists within the first main surface of the support body and is located so as to include at least a gravity center position of the first main surface. The radiation converting film is an Eu-doped photostimulable phosphor layer, and is comprised of columnar crystals which are coincident or tilted at a predetermined angle with respect to a normal direction of the first main surface.

Particularly, in the radiation image converting panel according to the present invention, for an Eu concentration distribution of the radiation converting film, a concentration gradient is provided so as to become higher in a peripheral area than in the radiation converting film located on the gravity center position (a central area). In concrete terms, in the film forming region of the first main surface, an Eu concentration of the radiation converting film, located on a peripheral area sandwiched by an edge of the film forming region and a circumference of a reference circle around the gravity center position, is set higher than an Eu concentration of the radiation converting film located on the gravity center position. Here, the reference circle has a radius of 40% or more but 80% or less of a minimum distance from the gravity center position to the edge of the film forming region.

Also, in the radiation image converting panel according to the present invention, the Eu concentration of the radiation converting film preferably monotonically increases from the gravity center position toward the circumference of the reference circle. Moreover, since an optimal value of the Eu concentration corresponding to the gravity center position changes depending on the laser wavelength and laser beam characteristics of an optical scanning device, sensitivity of an image pickup device, and the like, the Eu concentration of the radiation converting film located on the gravity center position is preferably 0.001 wt % or more but 0.3 wt % or less.

In the radiation image converting panel according to the present invention, for more effectively suppressing a drop in luminance of the radiation converting film, the Eu concentration of the radiation converting film located on the peripheral area is preferably 0.06 wt % or more. However, for maintaining the luminance of the entire radiation image converting panel in a uniform state, the Eu concentration of the radiation converting film on the peripheral area is preferably two times or less higher than the Eu concentration of the radiation converting film located on the gravity center position.

Furthermore, the radiation image converting panel according to the present invention may comprise a moisture-resistant protective film (transparent organic film) that covers an exposed surface of the radiation converting film without a surface of the radiation converting film covered by the first main surface of the support body (the surface attached to the first main surface).

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will be apparent to those skilled in the art from this detailed description.

BRIEF DESCRIPTION OF THE DRAWINGS

FIG. 8 is a table showing, with regard to the prepared radiation image converting panels (radiation converting films) of Samples Nos. 1 to 5, evaluation results of fluorescence lifetimes thereof.

DESCRIPTION OF THE PREFERRED EMBODIMENTS

Figures 1A, 1B, 1C:
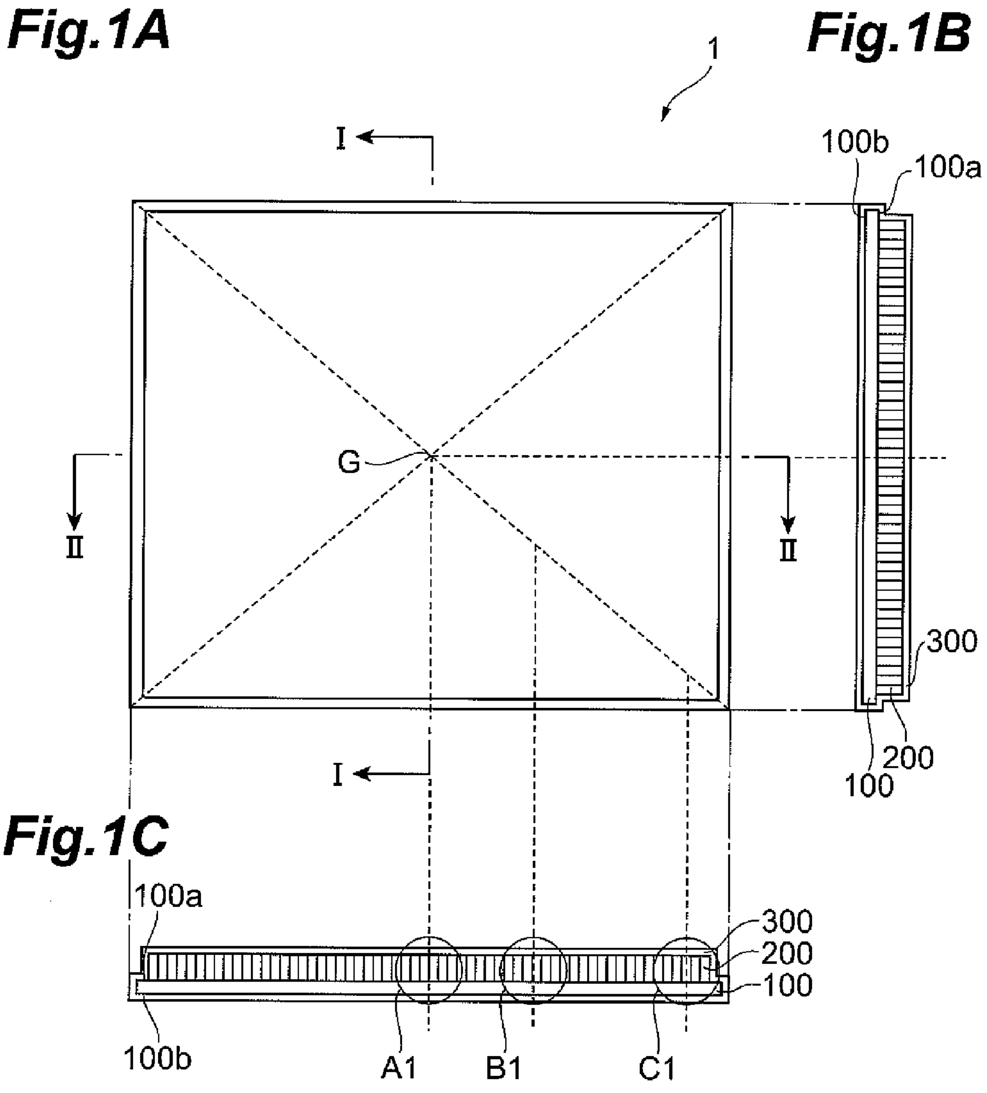
FIGS. 1A to 1C are views showing a structure of an embodiment of a radiation image converting panel according to the present invention.

In the following, embodiments of a radiation image converting panel according to the present invention will be explained in detail with reference to FIGS. 1A to 2C, 3 to 5, 6A to 7B, and 8. In the description of the drawings, identical or corresponding components are designated by the same reference numerals, and overlapping description is omitted.

FIGS. 1A to 1C are views showing a structure of an embodiment of a radiation image converting panel according to the present invention. In particular, FIG. 1A is a plan view of the radiation image converting panel 1, FIG. 1B is a sectional view of the radiation image converting panel 1 along the line I-I in FIG. 1A, and FIG. 1C is a sectional view of the radiation image converting panel 1 along the line II-II in FIG. 1A.

In FIGS. 1A to 1C, the radiation image converting panel 1 comprises a support body 100, a radiation converting film 200 formed on the support body 100, and a protective film 300 (transparent organic film) that entirely covers the support body 100 and the radiation converting film 200. The support body 100 is a parallel plate having a first main surface 100*a* on which the radiation converting film 200 is formed and a second main surface 100*b* opposing the first main surface 100*a*. The radiation converting film 200 is formed on a film forming region R, and the film forming region R exists within the first main surface 100*a* of the support body 100 and includes at least a gravity center position G of the first main surface 100*a*. This radiation converting film 200 is comprised of columnar crystals which are coincident or tilted at a predetermined angle with respect to a normal direction of the first main surface 100*a*.

Figure 2A:
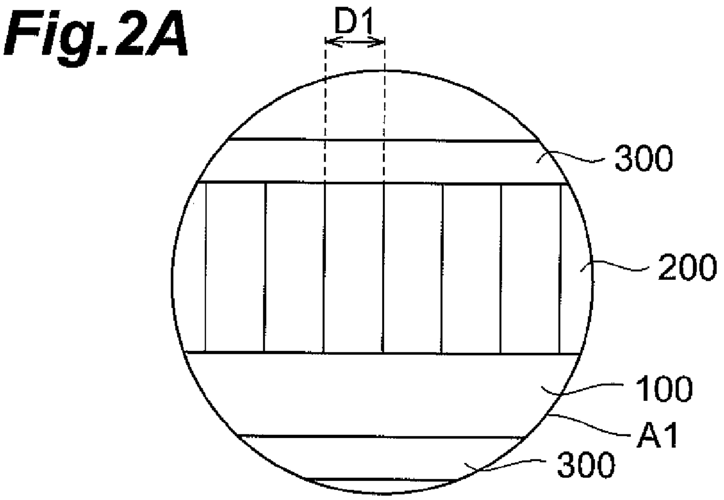
FIGS. 2A to 2C are views showing sectional structures of respective parts in a radiation converting film of a radiation image converting panel according to the present invention.
Figure 2B:
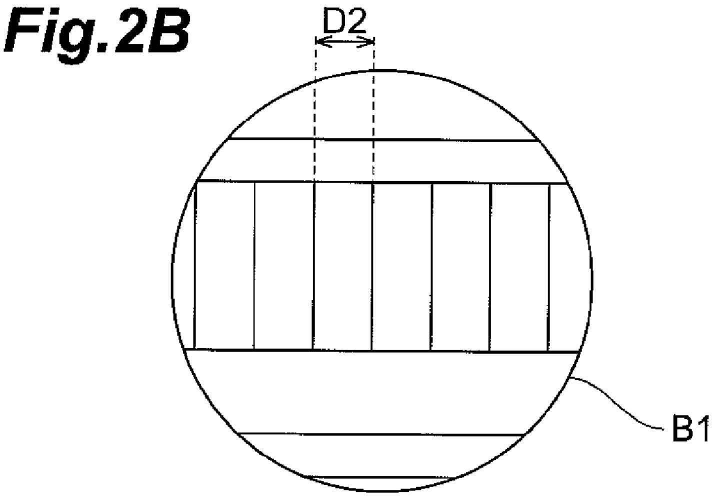
Figure 2C:
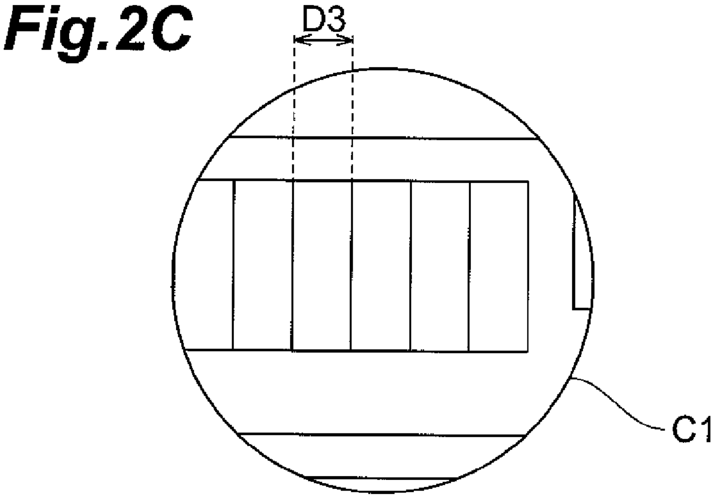

FIGS. 2A to 2C are views showing sectional structures of respective parts in a radiation converting film according to the present invention. In concrete terms, FIG. 2A is a sectional view of a region A1 in FIG. 1C, FIG. 2B is a sectional view of a region B1 in FIG. 1C, and FIG. 2C is a sectional view of a region C1 in FIG. 1C.

As can be understood from FIGS. 2A to 2C, the crystal diameters D1 to D3 of columnar crystals that form the radiation converting film 200 are all approximately 7 μm, which are almost uniform across the entire surface of the radiation converting film 200. However, the radiation converting film 200 has been doped with Eu being an activator, and the Eu has been doped so that Eu concentration gradually increases from the vicinity of the center toward the periphery of the radiation converting film 200. Although it has been discovered by the inventors that the Eu concentration contributes to suppression of a drop in luminance of the panel, by setting the Eu concentration high in the periphery where a drop in luminance is significant in comparison with the vicinity of the center, a sufficient fluorescence lifetime of the panel as a whole can be maintained.

Figure 3:
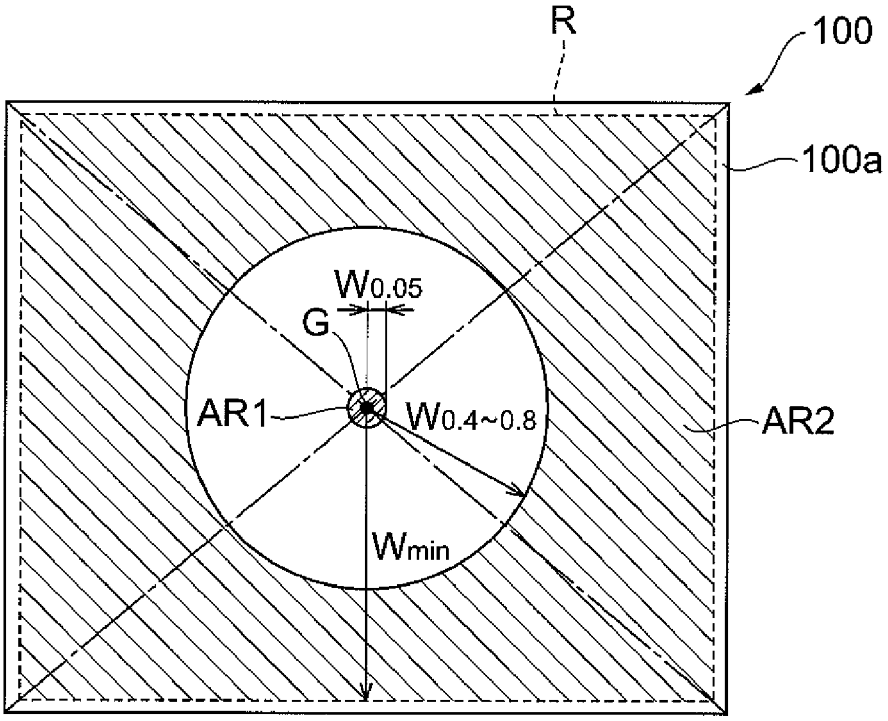
FIG. 3 is a view for concretely explaining a method for specifying a central area and a peripheral area on the first rain surface of a support body.

Next, by use of FIG. 3, description will be given, in terms of a film forming region R in the first main surface 100*a* of the support body 100, of a central area AR1 and a peripheral area AR2 of the film forming region R for defining an Eu concentration distribution of the radiation converting film 200 to be formed on the film forming region R. FIG. 3 is a view for concretely explaining a method for specifying a central area AR1 and a peripheral area AR2 in the first main surface 100*a* (film forming region R) of the support body 100.

The central area AR1 in the film forming region R is a local region including the gravity center position G. In concrete terms, this is a local region including the gravity center position G where a distance from the gravity center position G equals 5% of the minimum distance from the gravity center position G to an edge of the film forming region R (inside of a circle around the gravity center position G whose radius equals 5% of the minimum distance). On the other hand, the peripheral area AR2 in the film forming region R is a local region sandwiched by the circumference of a circle whose radius equals 40% to 80% of the minimum distance from the gravity center position G to an edge of the film forming region R and the edge of the film forming region R.

Also, the radiation converting film 200 is formed on the film forming region R of the first main surface 100*a* where the central area AR1 and the peripheral area AR2 are thus defined, and the vicinity of the center and periphery of the radiation converting film 200 may be considered as regions substantially coincident with the central area AR1 and the peripheral area AR2 defined in FIG. 3, respectively.

Figure 4:
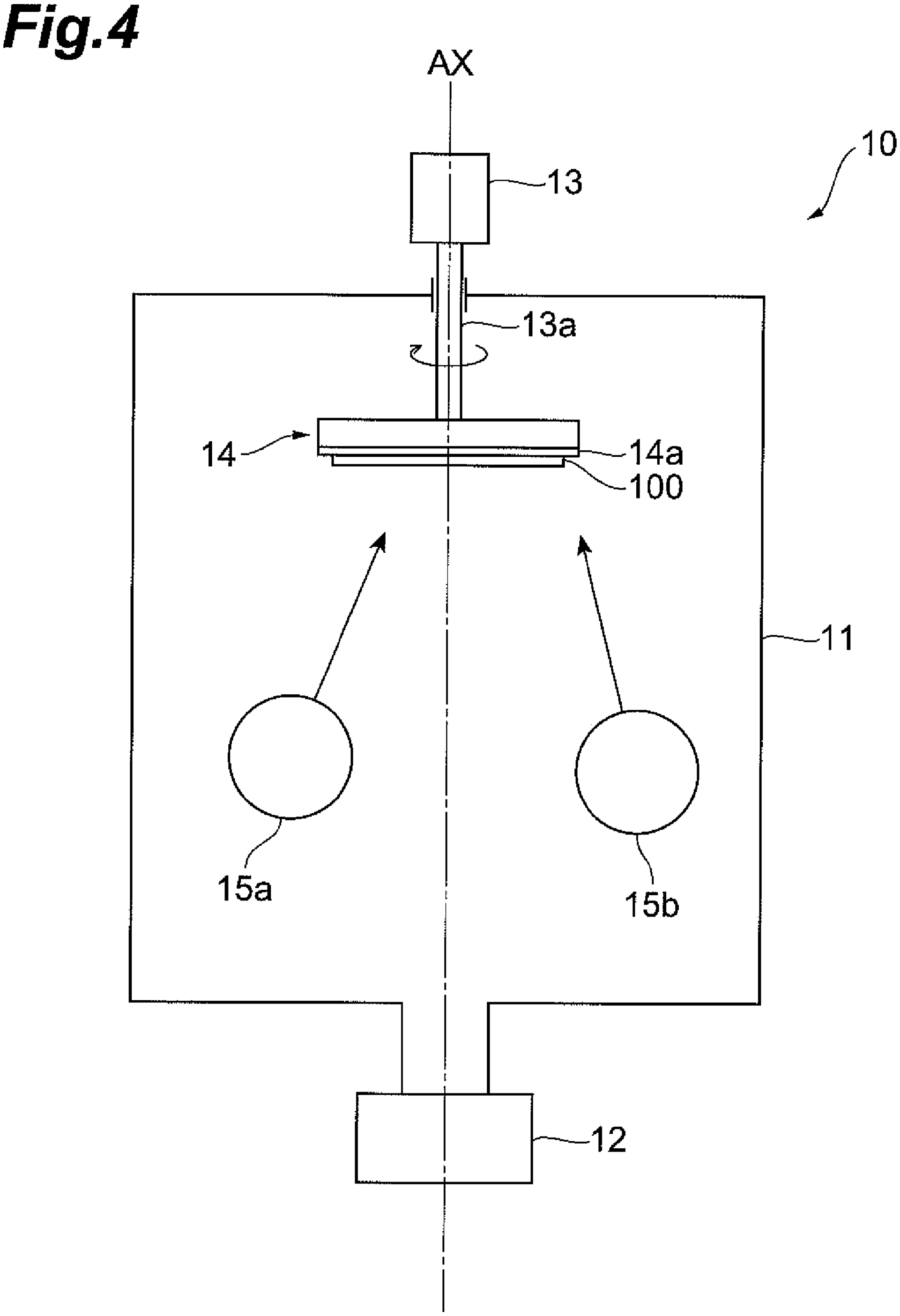
FIG. 4 is a view showing a configuration of a manufacturing apparatus for forming, on a support body, a radiation converting film, as a part of the manufacturing process of a radiation image converting panel according to the present invention.

Next, FIG. 4 is a view showing a configuration of a manufacturing apparatus for forming, on the support body 100, a radiation converting film 200 of the radiation image converting panel according to the present invention.

The manufacturing apparatus 10 shown in FIG. 4 is an apparatus that forms a radiation converting film 200 on the first main surface 100*a* of the support body 100 by a vapor-phase deposition method. As the vapor-phase deposition method, a vapor deposition method, a sputtering method, a CVD method, an ion plating method, or the like is applicable, and description will be given for, as an example, a case where the radiation converting film 200 of Eu-doped CsBr is formed on the support body 100 by a vapor deposition method. This manufacturing apparatus 10 comprises, at least, a vacuum container 11, a support body holder 14, a rotary shaft 13*a*, a drive unit 13, phosphor evaporation sources 15*a* and 15*b*, and a vacuum pump 12. The support body holder 14, the evaporation source 15, and a part of the rotary shaft 13*a* are arranged in the vacuum container 11. The support body holder 14 includes a heater 14*a* to heat the support body 100. One end of the rotary shaft 13*a* extended from the drive unit 13 is attached to the support body holder 14, and the drive unit 13 rotates the support body holder 14 via the rotary shaft 13*a*. Each of the phosphor evaporation sources 15*a* and 15*b*, which is arranged at a position deviated from a center axis AX of the vacuum container 11, holds a metal material supplied as a metal vapor to be vapor-deposited on the support body 100 installed on the support body holder 14. The vacuum pump 12 depressurizes the interior of the vacuum container 11 to a predetermined degree of vacuum.

In each of the phosphor evaporation sources 15*a* and 15*b*, a mixture material of CsBr and EuBr is set, however, concentration of the Eu serving as an activator is set higher in the phosphor evaporation source 15*b* than that in the phosphor evaporation source 15*a*. Moreover, the phosphor evaporation source 15*a* is set so that the inflow direction of a metal vapor points to the central area AR1 of the support body 100 from the position off the axis AX, while the phosphor evaporation source 15*b* is set so that the inflow direction of a metal vapor points to the peripheral area AR2 of the support body 100 from the position off the axis AX. The support body 100 is set on the support body holder 14. The crystal diameter of columnar crystals to be formed on a surface, of the support body 100, facing the phosphor evaporation sources 15*a* and 15*b* is adjusted by adjusting the temperature of the support body 100 itself with the heater 14*a*, and by controlling the degree of vacuum in the vacuum container 11, an inflow angle of the metal vapor from the material sources 15*a* and 15*b* to the support body 100, and the like.

First, columnar crystals of Eu-doped CsBr are grown on the first main surface 100*a* (the surface facing the phosphor evaporation sources 15*a* and 15*b*) of the support body 100 by a vapor deposition method. At this time, the drive unit 13 is rotating the support body holder 14 via the rotary shaft 13*a*, and accordingly, the support body 100 is also rotating around the axis AX.

By such a vapor deposition method, a radiation converting film 200 with a film thickness of 500 μm±50 μm is formed on the support body 100. At this time, the crystal diameter of columnar crystals in the radiation converting film 200 is approximately 7 μm. Moreover, the Eu concentration of the radiation converting film 200 located on the central area AR1 is 0.3 wt % to 0.5 wt %, and the Eu concentration of the radiation converting film 200 located on the peripheral area AR2 is 0.7 wt % or more. This is because a decline in luminance occurs when the Eu concentration is excessively high, while satisfactory results of a constant-temperature and high-humidity test (fluorescence lifetime evaluation) can be obtained when the Eu concentration is high. Accordingly, the Eu concentration of the radiation converting film 200 located on the central area AR1 is set to an optimal value, while the Eu concentration is set high in the radiation converting film 200 located on the peripheral area AR2 as a countermeasure against a drop in luminance.

The CsBr being a material of the radiation converting film 200 formed on the support body 100 as described above is highly hygroscopic. The radiation converting film 200 absorbs vapor in the air to deliquesce when this is kept exposed. Therefore, subsequent to the forming step of the radiation converting film 200 by a vapor deposition method, a moisture-resistant protective film 300 is formed by a CVD method so as to cover an exposed surface as a whole of the radiation converting film 200. More specifically, the support body 100 on which the radiation converting film 200 has been formed is placed in a CVD apparatus, and a moisture-resistant protective film 300 with a film thickness of approximately 10 μm is formed on the exposed surface of the radiation converting film 200. Thereby, the radiation image converting panel 1 for which the moisture-resistant protective film 300 has been formed on the radiation converting film 200 and the support body 100 is obtained.

Figure 5:
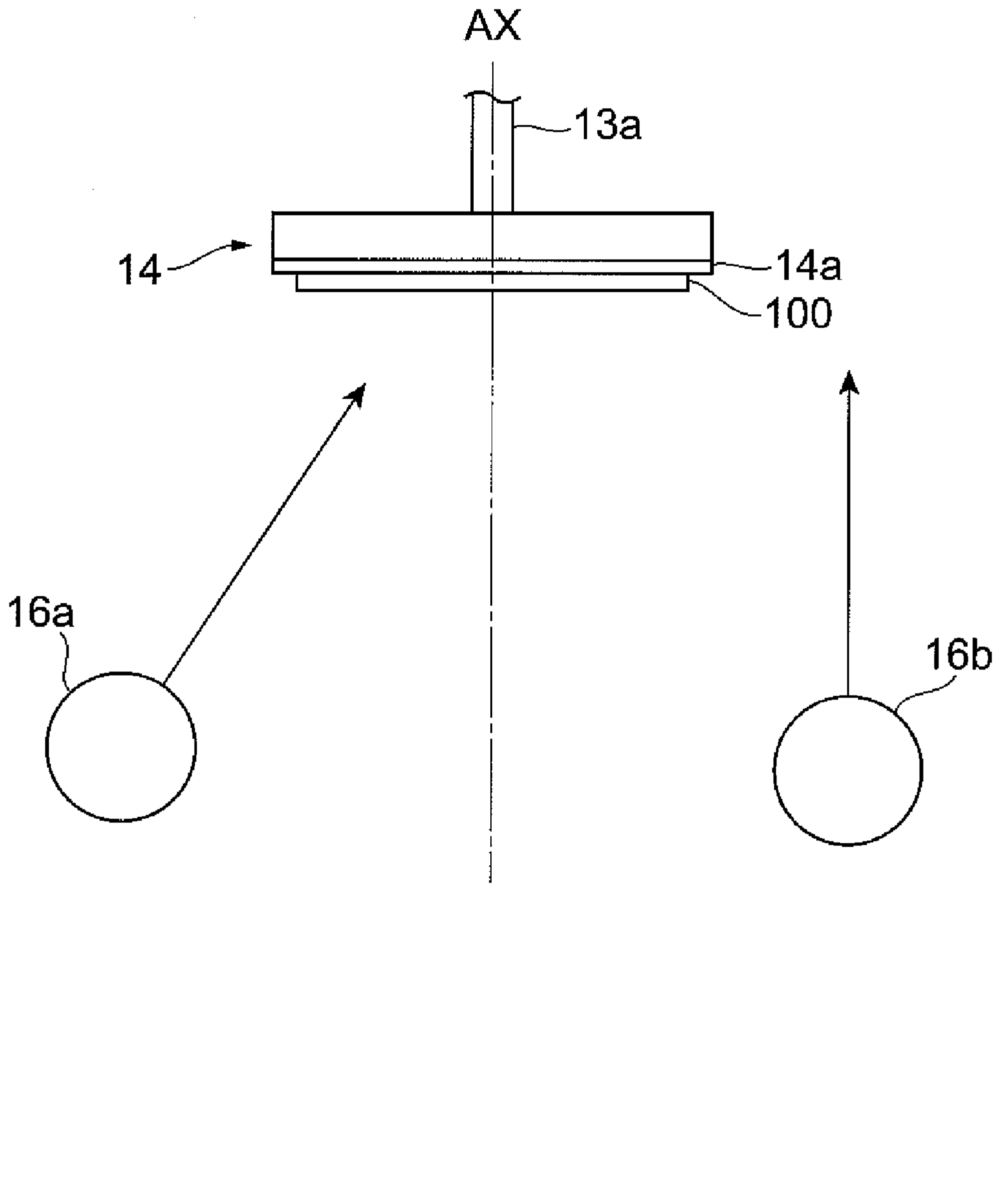
FIG. 5 is a view showing another configuration of a manufacturing apparatus for forming, on a support body, a radiation converting film, as a part of the manufacturing process of a radiation image converting panel according to the present invention.

Control of the Eu concentration in the radiation converting film 200 to be formed on the support body 100 is realized not only by the arrangement of the phosphor evaporation sources 15*a* and 15*b* as shown in FIG. 4, but this can also be realized by an arrangement shown in FIG. 5.

More specifically, in the vacuum container 11, as shown in FIG. 5, a base material evaporation source 16*a* and an activator evaporation source 16*b* may be arranged at positions off the axis AX. In the base-material evaporation source 16*a*, CsBr is set, and in the activator evaporation source 16*b*, EuBr is set. Also, the base material evaporation source 16*a* is set so that the inflow direction of a metal vapor points to the peripheral area AR2. The activator evaporation source 16*b* is set so that that the inflow direction of a metal vapor becomes off the support body 100. In the case where the base material evaporation source 16*a* and the activator evaporation source 16*b* are thus arranged as well, similar to the manufacturing apparatus 10 shown in FIG. 4, it is possible to control the Eu concentration.

Figures 6A, 6B:
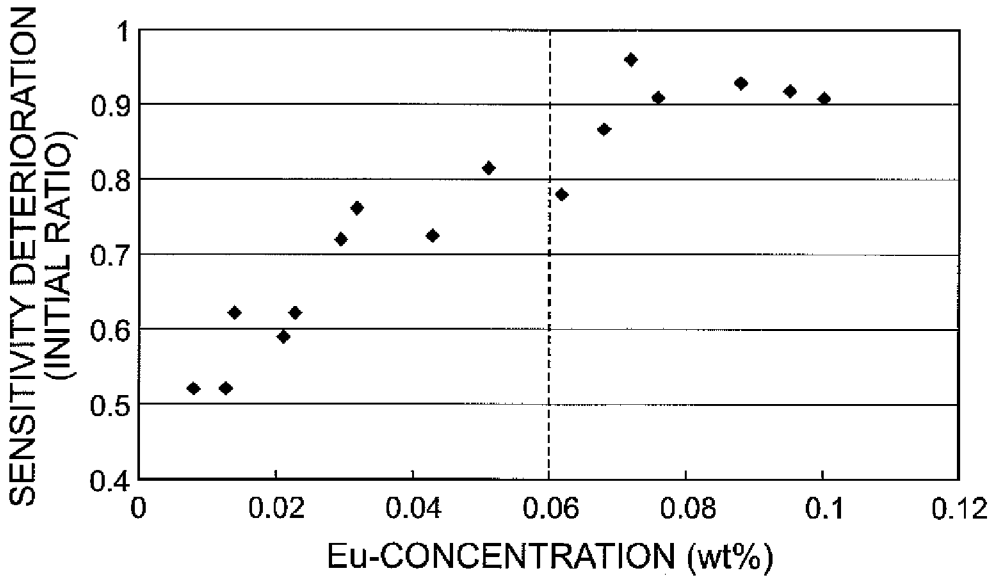
FIGS. 6A and 6B are a table and a graph showing relationships between the Eu concentration and sensitivity deterioration (initial ratio of luminance) in the peripheral areas of radiation converting films.

Next, the inventors examined an Eu concentration that allows effectively controlling a drop in luminance in the peripheral area AR2 of the radiation converting film 200. FIGS. 6A and 6B show relationships between the Eu concentration and sensitivity deterioration (initial ratio of luminance) of the radiation converting films 200 located on the peripheral areas M2. In particular, FIG. 6A is a table where various Eu concentrations and sensitivity deteriorations (initial ratios) of samples corresponding thereto are listed. Here, shown are numerical values of fluorescence lifetime evaluations performed by measuring the luminance values of samples used for one month (720 hours) under an environment with a temperature of 25° C. and a humidity of 50%. In concrete terms, these are ratios of luminance values measured after usage to initial luminance values. FIG. 6B is a graph plotting the relationships between the Eu concentration (wt %) and initial ratio shown in FIG. 6A.

As can be understood from FIG. 6B, since the region of an Eu concentration where the initial ratio exceeds 80% in a stable manner is a region of 0.06 wt % or more, the Eu concentration in the peripheral area AR2 of the radiation converting film 200 is preferably at least 0.06 wt % or more.

Figures 7A, 7B:
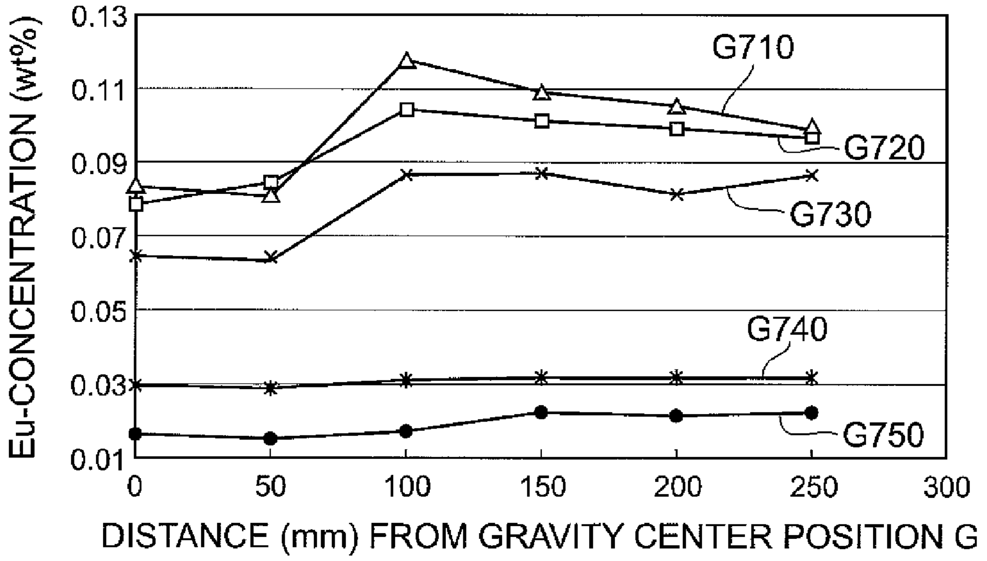
FIGS. 7A and 7B are a table and a graph showing relationships between the measuring position (distance from the gravity center position) and the Eu concentration, with regard to prepared radiation image converting panels (radiation converting films) of Samples No. 1 to No. 5.

FIGS. 7A and 7B show relationships between the measuring position (distance from the gravity center position) and the Eu concentration, with regard to radiation converting films of Samples No. 1 to No. 5 having the Eu concentration distribution as described above. In particular, FIG. 7A shows Eu concentrations at respective positions of distances from the gravity center position G of 0 mm, 50 mm, 100 mm, 150 mm, 200 mm, and 250 mm, with regard to Samples No. 1 to No. 5, respectively. Moreover, FIG. 7B is a graph plotting the relationships between the distance (mm) and the Eu concentration (wt %) shown in FIG. 7A. Also, when a minimum distance from the gravity center position G to the edge of the film forming region R is 250 mm, 40% of the minimum distance equals 100 mm. In these Samples No. 1 to No. 5, a region separated from the gravity center position G by 100 nm or more is the periphery of the radiation converting film corresponding to the peripheral area AR2.

Each of the radiation converting films of Samples No. 1 to No. 3 has been doped with Eu of 0.6 wt % or more to adjust the Eu concentration so as to be higher in the periphery (corresponding to the peripheral area AR2) than in the vicinity of the center (corresponding to the central area AR1) of the radiation converting film. On the other hand, the radiation converting films of Samples No. 4 and No. 5 have been doped with Eu of a concentration far smaller than 0.6 wt % wholly and almost uniformly as comparative examples. In FIG. 7B, graph G710 shows an Eu concentration distribution of Sample No. 2, graph G720 shows an Eu concentration distribution of Sample No. 1, graph G730 shows an Eu concentration distribution of Sample No. 3, graph G740 shows an Eu concentration distribution of Sample No. 4 according to a comparative example, and graph G750 shows an Eu concentration distribution of Sample No. 5 according to a comparative example.

Furthermore, FIG. 8 is a table showing, with regard to the prepared radiation converting films of Samples No. 1 to No. 5, evaluation results of fluorescence lifetimes thereof. The concrete fluorescence lifetime evaluations were performed by measuring the luminance values of samples used for one month (720 hours) under an environment with a temperature of 25° C. and a humidity of 50%. In this case, a sample whose measured luminance value has been maintained at 80% or more as a ratio (initial ratio) to the initial luminance value is shown with an evaluation ○, and a sample whose luminance value is practically acceptable even at 80% or less, with an evaluation Δ, and a sample whose luminance value has been lowered to a practically unacceptable extent, with an evaluation x.

In the radiation converting films of Samples No. 1 to No. 3, the Eu concentration in the peripheral area AR2 separated from the gravity center position G by 100 mm or more was 0.6 wt % or more and higher than the Eu concentration corresponding to the gravity center position. Deterioration in fluorescence lifetime in the peripheral area AR2 has not been recognized in any of Samples No. 1 to No. 3. On the contrary, in the radiation converting films of Samples No. 4 and No. 5 according to comparative examples, the Eu concentration has been almost uniformly distributed from the gravity center position G to the edge of the film forming region R, and deterioration in fluorescence lifetime in the peripheral area AR2 has been recognized in both samples. By thus providing a concentration gradient for the Eu concentration distribution of the radiation converting film 200 so that the Eu concentration of the radiation converting film 200 existing on the peripheral area AR2 of the film forming region R becomes higher than the Eu concentration of the radiation converting film 200 existing on the central area AR1 of the film forming region R defined on the first main surface 100*a* of the support body 100, in particular, the gravity center position G, deterioration in fluorescence lifetime of the radiation image converting panel is effectively suppressed.

Also, as can be understood from FIGS. 7A and 7B, with regard to Samples No. 1 to No. 3, the Eu concentration has monotonically increased from the gravity center position G to the distance of 100 mm. Moreover, with regard to Samples No. 1 to No. 3, the Eu concentration as a whole is 0.6 wt % or more, and the Eu concentration in the peripheral area AR2 is two times or less higher than the Eu concentration at the gravity center position G.

As has been described above, in accordance with the present invention, as a result of providing a concentration gradient for the concentration distribution of Eu to be doped in a radiation converting film so as to become higher in the periphery than in the vicinity of the center of the radiation converting film, a drop in luminance is reduced even in the periphery of the radiation converting film where, usually, the drop in luminance is more significant than in the vicinity of the center. Thereby, a sufficient fluorescence lifetime of the radiation image converting panel as a whole is maintained.

From the invention thus described, it will be obvious that the embodiments of the invention may be varied in many ways. Such variations are not to be regarded as a departure from the scope of the invention, and all such modifications as would be obvious to one skilled in the art are intended for inclusion within the scope of the following claims.

What is claimed is:

1. A radiation image converting panel comprising:

a support body having a first main surface and a second main surface opposing said first main surface; and an radiation converting film doped with Eu and provided on a film forming region which exists within said first main surface of said support body and includes at least a gravity center position of said first main surface, said radiation converting film being comprised of columnar crystals which are coincident or tilted at a predetermined angle with respect to a normal direction of said first main surface, wherein, in said film forming region of said first main surface, an Eu concentration of said radiation converting film, located on a peripheral area sandwiched by an edge of said film forming region and a circumference of a reference circle around the gravity center position, is set higher than an Eu concentration of said radiation converting film located on the gravity center position, said reference circle having a radius of 40% or more but 80% or less of a minimum distance from the gravity center position to the edge of said film forming region.

2. A radiation image converting panel according to claim 1, wherein the Eu concentration of said radiation converting film monotonically increases from the gravity center position toward the circumference of the reference circle.

3. A radiation image converting panel according to claim 1, wherein the Eu concentration of said radiation converting film located at the gravity center position is 0.001 wt % or more but 0.3 wt % or less.

4. A radiation image converting panel according to claim 1, wherein the Eu concentration of said radiation converting film located on the peripheral area is 0.06 wt % or more.

5. A radiation image converting panel according to claim 1, wherein the Eu concentration of said radiation converting film located on the peripheral area is two times or less higher than the Eu concentration of said radiation converting film located on the gravity center position.

6. A radiation image converting panel according to claim 1, further comprising a protective film that covers an exposed surface of said radiation converting film excluding a surface covered by said first main surface of said support body.

* * * * *